United States Patent [19]

Burns et al.

[11] 4,348,074
[45] Sep. 7, 1982

[54] APPLICATION OF ION IMPLANTATION TO LINBO₃ INTEGRATED, OPTICAL SPECTRUM ANALYZERS

[75] Inventors: William K. Burns, Alexandria; Thomas G. Giallorenzi, Springfield, both of Va.

[73] Assignee: The United States of America as represented by the Secretary of the Navy, Washington, D.C.

[21] Appl. No.: 126,268

[22] Filed: Mar. 3, 1980

[51] Int. Cl.³ .............................................. G02B 5/174
[52] U.S. Cl. ............................. 350/96.11; 324/77 K; 350/96.12
[58] Field of Search .............. 350/96.11, 96.12, 96.13, 350/96.14, 96.17, 96.18, 96.19; 315/111.8; 324/77 K; 148/1.5, 186

[56] References Cited

U.S. PATENT DOCUMENTS

| | | | |
|---|---|---|---|
| 3,873,828 | 3/1975 | Hunsperger et al. | 350/96.12 X |
| 4,253,060 | 2/1981 | Chen | 350/96.14 X |
| 4,274,049 | 6/1981 | Stoll | 350/96.13 X |

OTHER PUBLICATIONS

Wei et al., "Large Refractive Index Change Induced by Ion Implantation In . . . ", *Appl. Phys. Lett.*, vol. 25, No. 6, Sep. 1974, pp. 329-331.

Anderson, "Integrated Optical Spectrum Analyzer: . . . ", *IEEE Spectrum*, Dec. 1978, pp. 22-29.

Burns et al., "Applications of Ion Implantation to Integrated Optical Spectrum Analyzers", *Optics Letters*, vol. 5, No. 2, Feb. 1980, pp. 45-47.

*Primary Examiner*—John D. Lee
*Attorney, Agent, or Firm*—Robert F. Beers; William T. Ellis; Melvin L. Crane

[57] ABSTRACT

A method of improving the signal-to-noise ratio (dynamic range) in integrated optical spectrum analyzers. An integrated optical spectrum analyzer is formed with a lithium niobate (LiNbO₃) substrate in its usual manner. Ions such as argon or hydrogen are implanted in the bottom and sides of the LiNbO₃ which causes the substrate to absorb light at the wavelength of interest. The ion-implanted bottom and sides provide absorption with very little reflectivity and the amount of absorption is proportional to the effect of the ion and the time period of implantation. The bottom and sides behave as optical sinks, rather than as reflection or scattering centers.

15 Claims, 3 Drawing Figures

APPLICATION OF ION IMPLANTATION TO LINBO3 INTEGRATED, OPTICAL SPECTRUM ANALYZERS

BACKGROUND OF THE INVENTION

This invention relates to integrated optical spectrum analyzers and more particularly to a method of improving the signal-to-noise ratio of such devices.

Integrated optical spectrum analyzers (IOSA) are under development as set forth in the article, "An Integrated Optical RF Spectrum Analyzer", by M. C. Hamilton et. al., Optical Engr. 16, 475–478, Sept./Oct. 1977. Briefly the IOSA is a planar waveguide into which a laser is end-fire-coupled, collimated, Bragg-diffracted by a surface acoustic wave, and focused on a detector array. The detector array must be external to the optical waveguide system (Ti:LiNbO$_3$) which is of interest for this disclosure. An important consideration in such a device is the usable signal-to-noise ratio or dynamic range. Dynamic range is limited by any optical radiation which reaches the photosensitive detectors other than the desired optical signal. Such optical background noise typically arises from scattered light which is lost from the input laser beam and reflections of both the primary input laser beam and secondary scattered light from it. In some circumstances radiation from the guided optical laser beam may also give rise to a background signal. Typically scattering is due to surface imperfections and edge imperfections on input and output coupling. Additional background sources are both laser light and spontaneous emission from the laser which is coupled into the substrate.

Of the two materials systems currently of interest for IOSA applications, silicon (Si) and lithium niobate (LiNbO$_3$), the problem is not so severe for the Si system because the Si substrate is highly absorbing for the optical radiation at the wavelength of interest (0.83 $\mu$m). Then all light in the substrate is absorbed and no reflections or scattering from the bottom surface of the substrate can reach the photodiodes. LiNbO$_3$, however, is transparent at a wavelength of 0.83 $\mu$m and LiNbO$_3$ substrates will not attenuate any light in the substrate. Reflections are substantial in LiNbO$_3$ because the high index of refraction (2.2) of the material causes a normal-incidence reflectivity of approximately 15%. Low-angle reflections can be much larger, approaching 100%. Scattered or reflected light from the bottom surface of the substrate is a severe limitation on device dynamic range.

SUMMARY OF THE INVENTION

Ions are implanted along the bottom and sides of a substrate of an integrated optical spectrum analyzer in order to absorb stray light incident on the ion-implanted surface. The implantation of ions produces thin light-absorbing layers of controlled depths in selected areas of the optical waveguide. The use of ion implantation allows the bottom and sides of the device to be implanted without disturbing the optical waveguide on the top surface of the device. The use of ion implantation allows the bottom and sides of the substrate to behave as optical sinks, rather than as reflection or scattering centers. Additionally, the main beam through the waveguide can be absorbed by an ion-implanted region produced in an area after the main beam has passed the Bragg diffraction region.

DETAILED DESCRIPTION

Figure 1:
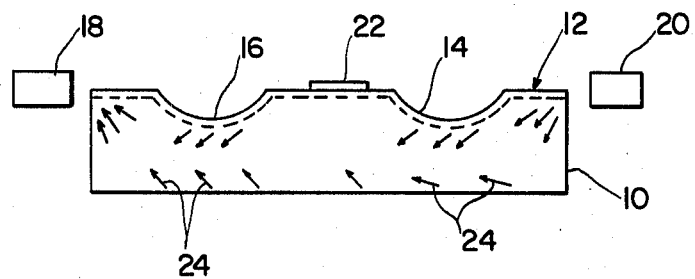
FIG. 1 is a side view of a LiNbO$_3$ IOSA which shows scattered light in a device without ion implantation.

FIG. 1 illustrates a prior-art integrated optical spectrum analyzer including a LiNbO$_3$ substrate 10 including a titanium-diffused waveguide 12 along the upper surface of the substrate. The device includes a collimator lens 14 and a transform lens 16 for focusing the beam to a photodiode array 18. The output of a laser 20 is coupled to the waveguide 12 for propagating the radiation to the photodiode array 18. The device also includes a surface acoustic wave (SAW) generating device 22 which directs a SAW perpendicular to the light beam between lenses 14 and 16. The arrows 24 in FIG. 1 illustrate stray light which is reflected from the sides and bottom of the substrate.

Figure 2:
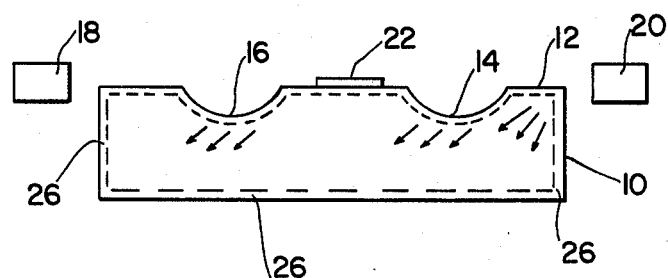
FIG. 2 illustrates a device such as shown in FIG. 1 with an ion implanted absorbing layer.

FIG. 2 illustrates an IOSA such as shown in FIG. 1 with the exception that the device of FIG. 2 includes an ion-implanted layer 26 along the bottom and side surfaces. The ion-implanted layer acts as a light-absorption means which absorbs stray and scattered light lost from the light beam as the light beam passes through the waveguide. Scattering of such light is due to surface imperfections, edge imperfections, and imperfect input coupling. The ion-implanted layer along the bottom and sides absorbs the stray and scattered light before it reaches the substrate boundaries where it will scatter and reflect, creating background noise. The ion layer may be implanted after the IOSA has been fabricated without disturbing any of the other elements of the device. Also, the substrate need not be heated during the implantation of the ions. Ion implantation may be performed with any ion that causes sufficient absorption at the desired wavelength. Good absorption ions have been found to be inert gases such as argon, krypton and xenon. Ions such as hydrogen, sodium or potassium may have a reducing effect which also results in absorption.

An ion-implanted layer is of about 1.0 $\mu$m in thickness and formed by implanting appropriate ions such as H$^{30}$ at an energy of about 100 KeV at a fluence of from $10^{16}$ or $10^{17}$ ions/cm$^2$ for a period of about 1 hour. The implantation is carried out separately from the bottom and each side. Other ions may be implanted at an energy and dose well known in the prior art for implanting ions. The energy and influence is not considered to be new and is well within the realm of one skilled in the art.

Figure 3:
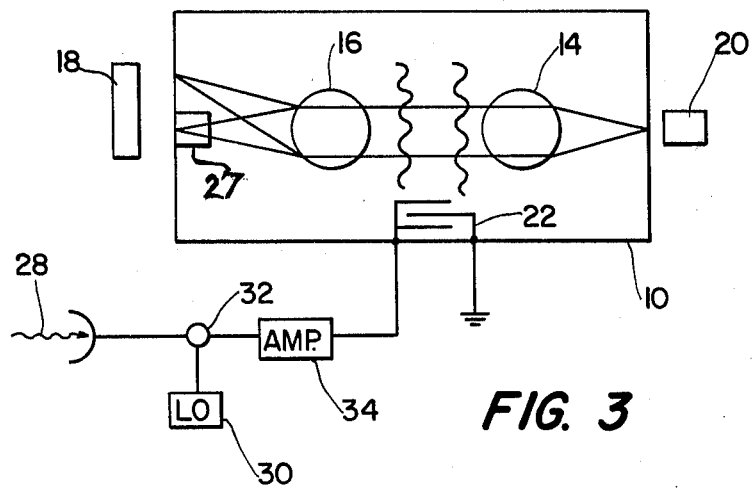
FIG. 3 is a top view illustrating an ion implanted beam dump.

It has been determined that the undiffracted portion of the main beam is a source of background noise. Therefore, a region near the end surface of the substrate adjacent to the photodetector may be implanted with ions to absorb the main beam or to form a "beam dump". FIG. 3 illustrates a top view of an IOSA made as set forth for the device of FIG. 2, except that FIG. 3 includes a beam dump 27 formed by implanting ions into the top surface along the center of the waveguide near the output end in order to receive or absorb the light of the main beam. The beam dump then prevents the light of the main beam from incidence on the photodetector.

In operation, an electrical signal 28 is received and mixed with a signal from a local oscillator 30 in mixer 32 such that the signal is within the analyzer bandpass. The signal is amplified by amplifier 34 and directed to a surface acoustic wave transducer 22 to produce surface acoustic waves. The surface acoustic waves traverse the optical waveguide and produce a periodic perturbation of the effective index of refraction of the waveguide mode. If the collimated light beam guided in the waveguide intersects the acoustic beam at the Bragg angle, a portion of the collimated light beam will be diffracted at an angle which is closely proportional to the acoustic frequency. The diffracted light then passes through the transform lens 16 to the detector array 18. The intensity distribution in the focal plane of the waveguide transform lens represents the power spectrum of the input signal. In those IOSA devices having an ion-implanted beam dump, such as shown in FIG. 3, the main beam will be absorbed by the beam dump. In those devices not containing a beam dump, the main signal as well as the diffracted beam will be incident upon the detector array. Since the bottom and sides of the waveguide substrate have an implanted ion layer, any stray and scattered light reaching an ion-implanted layer will be absorbed by it and will not be reflected or scattered in a direction where it could reach the detector as noise. With the implanted layer, the signal-to-noise ratio is improved.

Ion implantation can be performed with any ions such as $Ar^+$, $Kr^+$, $Xe^+$, $H_2^+$, $Na^+$, $K^+$, that causes absorption at the desired wavelength. Other ions such as metallic ions of iron, silver, etc. may be used.

Instead of forming absorption by ion implantation a part of the $LiNbO_3$ substrate may be reduced by heating the substrate above 500° and exposing the bottom and sides of the substrate to a reducing environment such as $H_2$ gas, Ar gas, or in a vacuum.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. In an improved integrated optical spectrum analyzer, including a waveguide, a substrate, a light source, a collimator lens, a transform lens, a light-detector array and a SAW means, the improvement comprising:
light-absorbing means within said substrate paralleling the bottom of said substrate.

2. The improvement in an integrated optical spectrum analyzer as claimed in claim 1 which includes:
light-absorbing means within and paralleling the sides of said substrate.

3. The improvement in an integrated optical spectrum analyzer as claimed in claim 2 wherein:
said light-absorbing means within and paralleling said bottom and sides of said substrate are implanted ions.

4. The improvement in an integrated optical spectrum analyzer as claimed in claim 3 wherein:
said ions are selected from a group consisting of $H^+$, $H_2^+$, $Na^+$, and $K^+$.

5. The improvement in an integrated optical spectrum analyzer as claimed in claim 3 wherein:
said implanted ions are $H^+$.

6. The improvement in an integrated optical spectrum analyzer as claimed in claim 5 wherein:
said ions of $H^+$ are implanted at an energy of about 100 KeV to a fluence of from $10^{16}$ to $10^{17}$ ions/cm$^2$ for a period of about one hour to form an ion layer at a depth of about 1.0 μm.

7. The improvement in an integrated optical spectrum analyzer as claimed in claim 3 in which:
a main "beam dump" is formed in said substrate by ion implantation of ions between said transform lens and said detector array for absorbing the main light beam portion not diffracted by said transform lens.

8. The improvement in an integrated optical spectrum analyzer as claimed in claim 2 in which:
said light-absorbing means within and paralleling said bottom and sides of said substrate is partial reduction of said substrate by heating above 500° C. and exposing said bottom and sides to a reducing environment such as $H_2$ gas, Argon gas, or vacuum.

9. An improved, substantially rectangular substrate for use in an integrated optical system of the type with waveguides formed within the top surface of said substrate, the improvement comprising:
light-absorbing means within said substrate paralleling the bottom of said substrate.

10. The improvement set forth in claim 9, wherein the light-absorbing means is a thin layer of implanted ions.

11. The improvement set forth in claim 10 wherein said thin layer of implanted ions is adjacently disposed to the bottom surface of said substrate.

12. In a substrate as set forth in claim 9, the further improvement comprising:
light-absorbing means within said substrate paralleling the sides of said substrate.

13. The improvement set forth in claim 12, wherein all light-absorbing means comprise thin layers of implanted ions.

14. The improvement set forth in claim 13 wherein said thin layers of implanted ions are adjacently disposed to the bottom and side surfaces of said substrate.

15. The improvement set forth in claim 14, wherein the substrate is formed from $LiNbO_3$ and the ions for the implanted layers are selected from the group consisting of $H^+$, $H_2^+$, $Na^+$ and $K^+$.

* * * * *